(12) United States Patent
Dalena

(10) Patent No.: US 7,576,610 B2
(45) Date of Patent: Aug. 18, 2009

(54) OPERATIONAL AMPLIFIER OF CLASS AB

(75) Inventor: Francesco Maria Dalena, Putignano (IT)

(73) Assignee: STMicroelectronics S.r.l., Agrate Brianza (MI) (IT)

( * ) Notice: Subject to any disclaimer, the term of this patent is extended or adjusted under 35 U.S.C. 154(b) by 0 days.

(21) Appl. No.: 11/755,711

(22) Filed: May 30, 2007

(65) Prior Publication Data

US 2008/0001662 A1 Jan. 3, 2008

(30) Foreign Application Priority Data

May 31, 2006 (EP) .................................. 06011220

(51) Int. Cl.
*H03F 3/45* (2006.01)
(52) U.S. Cl. ................... 330/260; 330/253; 330/255; 330/257; 330/261
(58) Field of Classification Search ................. 330/253, 330/255, 257, 260, 261
See application file for complete search history.

(56) References Cited

U.S. PATENT DOCUMENTS

| | | | |
|---|---|---|---|
| 6,600,483 B1 | 7/2003 | Akita et al. | |
| 6,771,126 B2 * | 8/2004 | Blankenship et al. | ....... 330/261 |
| 7,061,320 B2 * | 6/2006 | Kimura et al. | ............... 330/255 |

FOREIGN PATENT DOCUMENTS

EP 0 776 087 A1 8/1996

OTHER PUBLICATIONS

Noceti Filho S et al., "New CMOS OTA for Fully Integrated Continuous-Time Circuit Applications", Electronics Letters, vol. 25, No. 24, Nov. 23, 1989, pp. 1674-1675, XP000075000 Issn: 0013-5194; Section: Convertor realisation; Figure 2; IEE Stevenage, GB.
European Search Report dated Oct. 20, 2006 for European Application No. EP 06 01 1220.

* cited by examiner

*Primary Examiner*—Khanh V Nguyen
(74) *Attorney, Agent, or Firm*—Lisa K. Jorgenson; Stephen Bongini; Fleit Gibbons Gutman Bongini & Bianco P.L.

(57) ABSTRACT

A class AB operational amplifier is provided that includes first and second input transistors respectively coupled between first and second internal nodes and a first common node, first and second input stage load transistors diode connected and respectively coupled between a first voltage reference and the first and second internal nodes, first and second output transistors coupled in series between the first voltage reference and a second voltage reference, a tail current generator coupled between the first common node and the second voltage reference, an adaptive bias block coupled between the first and second voltage references and coupled to the first common node, and a positive feedback network coupled between the first voltage reference and the first and second internal nodes. Also provided is an integrated circuit having at least one such operational amplifier.

22 Claims, 5 Drawing Sheets

OPERATIONAL AMPLIFIER OF CLASS AB

CROSS-REFERENCE TO RELATED APPLICATIONS

This application is based upon and claims priority from European Patent Application No. 06 011 220.8, filed May 31, 2006, the entire disclosure of which is herein incorporated by reference.

FIELD OF THE INVENTION

The present invention relates to electronic circuits, and more specifically relates to a class AB operational amplifier that is suitable for low voltage applications.

BACKGROUND OF THE INVENTION

As is well known, the increased complexity of mixed-signal Integrated Circuits (or IC's) makes it crucial to optimize their power consumption.

Moreover, the current market for IC's requires more and more a shift toward low voltage applications, making power consumption optimization even more critical.

For this aim, low power architectures have to be used as building blocks of a whole IC and innovative circuit topologies have to be explored.

It is also well known that the operational amplifier (or "op-amp") is probably the most widely used building block in analog IC's, as described for instance in the article by Wang et al. entitled "Optimal design for oversampled converter" (Proc. IEEE Custom Integrated Circuit Conf., 1996, pp. 337-340).

In particular, in a wide number of applications (for example, in switched capacitor circuits or in output stage circuits), the op-amps have to charge large capacitive loads. In these cases, the op-amps have to track large signals in a limited time.

The known op-amps can be substantially divided in two main groups or classes, namely the A and AB classes of amplifiers.

Class A op-amps have poor behavior with large signals due to their constant tail current, and thus they show a transient response that is slew-rate limited, as described by Klinke et al. in the article entitled "A Very-High-Slew-Rate CMOS Operational Amplifier" (IEEE Journal of Solid-State Circuits, vol. 24, no. 3, June 1989).

In the case of large signals to be tracked, an alternative solution is thus the use of class AB op-amps, with a push-pull output stage, as described in the article by Hogervorst et al. entitled "A Compact Power-Efficient 3V CMOS Rail-to-Rail Input/Output Operational Amplifier for VLSI Cell Libraries" (IEEE Journal of Solid-State Circuits, vol. 29, no. 12, December 1994).

The circuit topology described in this article, being a class AB op-amp, easily overcomes slew rate problems. However, such a circuit has a maximum output current which is not well controlled; this could be a problem in low-power applications, especially where a portable system with a battery aboard is concerned.

Yet another known solution is described by Callewaert et al. in the article entitled "Class AB CMOS amplifiers with high efficiency" (IEEE Journal of Solid-State Circuits, vol. 25, no. 3, June 1990). In this case, the proposed op-amp topology provides a boosting of the tail current of the input differential transistors for large signal operation. In this way, the current of the whole op-amp is increased in this operation state. This boosting mechanism is usually referred to as "adaptive bias".

An op-amp topology realized according to the adaptive bias principle and able to drive a large capacitive load is described in the article by Degrauwe et al. entitled "Adaptive biasing CMOS amplifier" (IEEE Journal of Solid-State Circuits, vol. SC-17, pp. 522-528, June 1982).

However, this known solution has a problem due to the fact that the DC-gain of the op-amp so obtained is limited, since it has just one pole at high impedance on its output node.

SUMMARY OF THE INVENTION

An object of the present invention is to overcome the limits which affect the known amplifiers and to provide an operational amplifier based on the adaptive bias principle that has structural and functional characteristics which allow reduced power consumption and, at the same time, enhanced DC-gain.

One embodiment of the present invention provides an operational amplifier having a fully symmetrical core, preferably of the OTA type in order to reduce power consumption, connected to an adaptive bias block that implements the adaptive bias principle, preferably comprising a positive feedback biasing block in order to enhance the DC-gain of the operational amplifier.

Another embodiment of the present invention provides a class AB operational amplifier that includes first and second input transistors respectively coupled between first and second internal nodes and a first common node, first and second input stage load transistors diode connected and respectively coupled between a first voltage reference and the first and second internal nodes, first and second output transistors coupled in series between the first voltage reference and a second voltage reference, a tail current generator coupled between the first common node and the second voltage reference, and an adaptive bias block coupled between the first and second voltage references and connected to the first common node.

A further embodiment of the present invention provides an integrated circuit that includes at least one such operational amplifier.

The characteristics and advantages of the operational amplifier according to the present invention will be apparent from the following description of embodiments thereof given by way of indicative and non-limiting example with reference to the annexed drawings.

DETAILED DESCRIPTION OF PREFERRED EMBODIMENTS

Preferred embodiments of the present invention will be described in detail hereinbelow with reference to the attached drawings.

Figure 1:
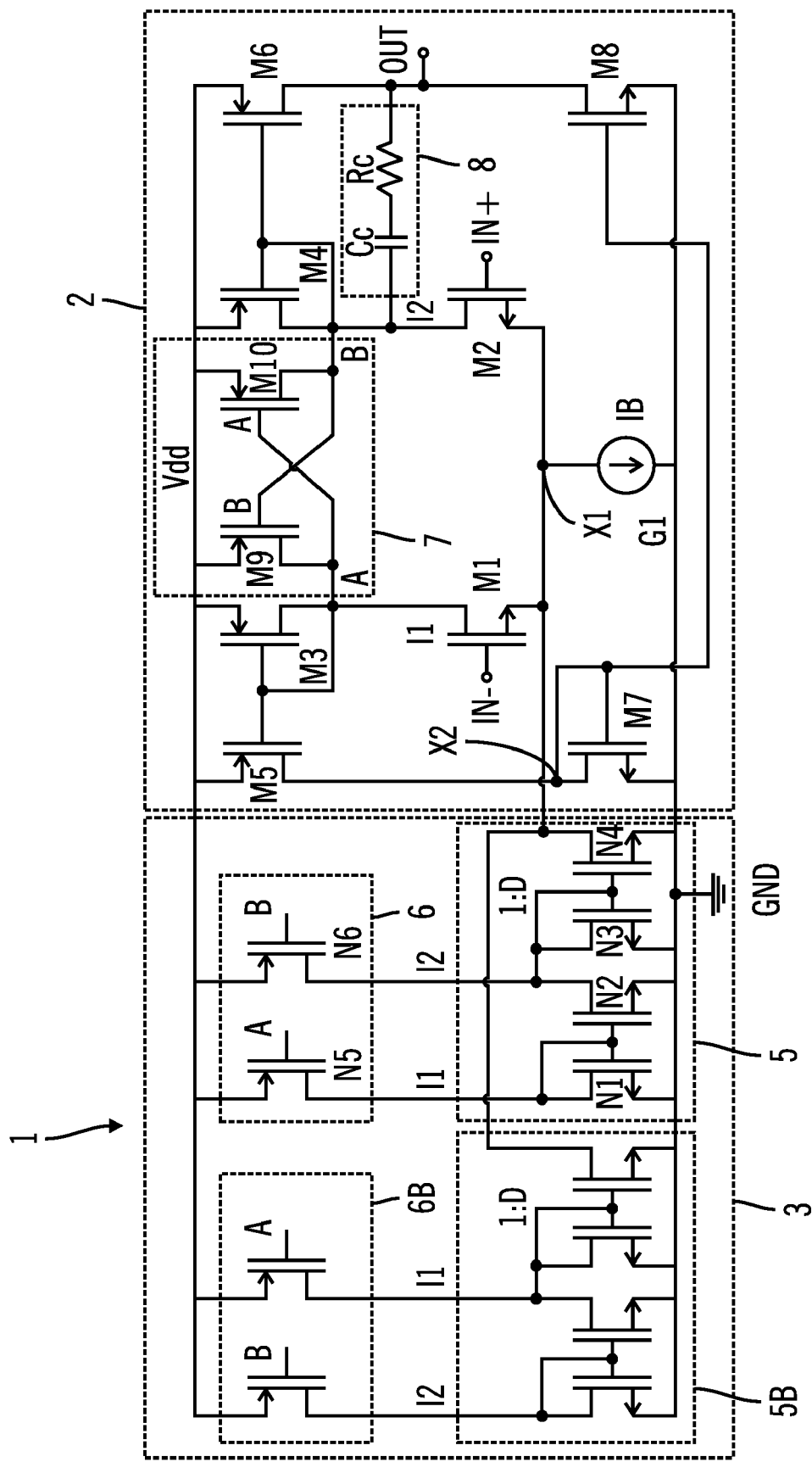
FIG. 1 shows an operational amplifier according to a preferred embodiment of the present invention.

FIG. 1 shows an operational amplifier (or "op-amp") according to a preferred embodiment of the present invention.

The op-amp 1 includes a core 2 and an adaptive bias block 3 connected between first and second voltage references, in particular a supply voltage reference Vdd and ground GND, and interconnected at a first common node X1.

Figure 2:
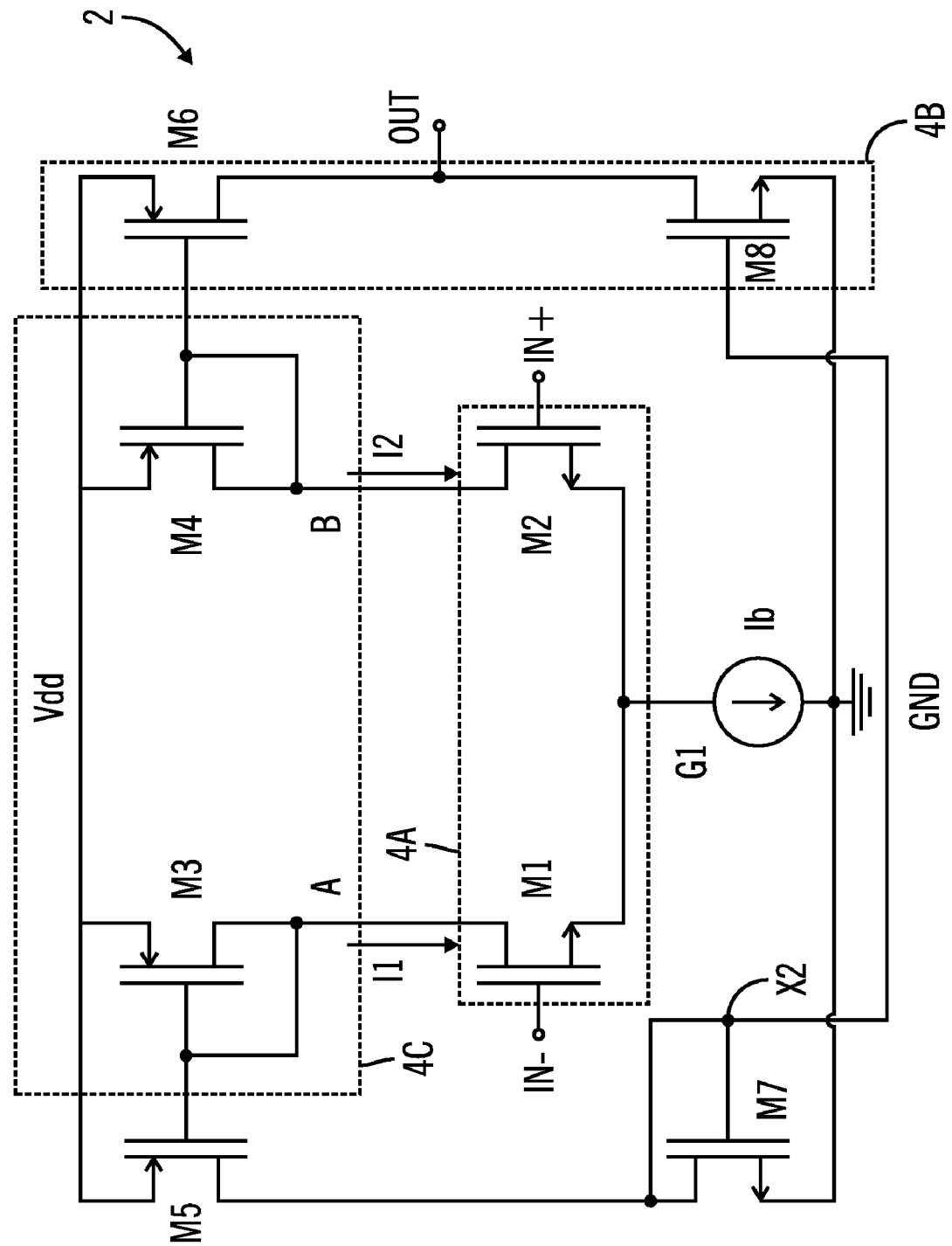
FIG. 2 shows a core of the operational amplifier of FIG. 1.

According to this embodiment of the present invention, the core 2 is realized by an OTA (Operational Transconductance Amplifier), as shown in FIG. 2. More particularly, the core 2 is a CMOS OTA with a symmetrical input stage comprising first and second input transistors M1 and M2.

These input transistors M1 and M2 are connected between respective first and second internal nodes A and B and the first common node X1, and have control (or gate) terminals respectively connected to a first input terminal IN− and a second input terminal IN+ of the op-amp 1.

The OTA 2 also comprises first and second input load stage transistors M3 and M4 that are diode connected between the supply voltage reference Vdd and respective conductive terminals, in particular drain terminals of the first and second input transistors M1 and M2, which correspond to the first and second internal nodes A and B.

Moreover, the first input stage load transistor M3 has a control (or gate) terminal connected to a control (or gate) terminal of a mirror transistor M5, which is connected between the supply voltage reference Vdd and a second common node X2.

The second input stage load transistor M4 has a control (or gate) terminal connected to a control (or gate) terminal of a first output transistor M6, which is connected between the supply voltage reference Vdd and an output terminal OUT of the op-amp 1.

A biasing transistor M7 is connected between the second common node X2 and ground GND, and has a control (or gate) terminal connected to the second common node X2 and to a control (or gate) terminal of a second output transistor M8, which is connected between the output terminal OUT and ground GND.

In particular, the OTA 2 has an input stage 4A comprising the first and second input transistors M1 and M2 and an output stage 4B comprising the first and second output transistors M6 and M8, as well as an input stage load 4C comprising the first and second input stage load transistors M3 and M4.

The first common node X1 is also connected to ground GND through a bias current (Ib) generator (or tail current generator) G1.

The advantage of this amplifier topology is its very good symmetry.

By suitably sizing the transistors of this OTA 2, the current flowing in the transistors M5 and M6 is made K1 times greater than the current flowing in the first and second input stage load transistors M3 and M4, in order to obtain a GBW (Gain BandWidth) K1 times the GBW of a standard OTA configuration. It is however verified that the total power consumption of such an OTA 2 is (K1+1) times larger as well, with factor K1 being normally increased to increase the slew rate.

The first and second internal nodes A and B are at low impedance, so a dominant pole of the transconductance function of the op-amp 1 is due to an output impedance of the OTA 2.

According to this embodiment of the present invention, the op-amp 1 exploits the adaptive bias principle, as described above, by using an adaptive bias block 3 that is connected to the first common node X1.

Figure 3:
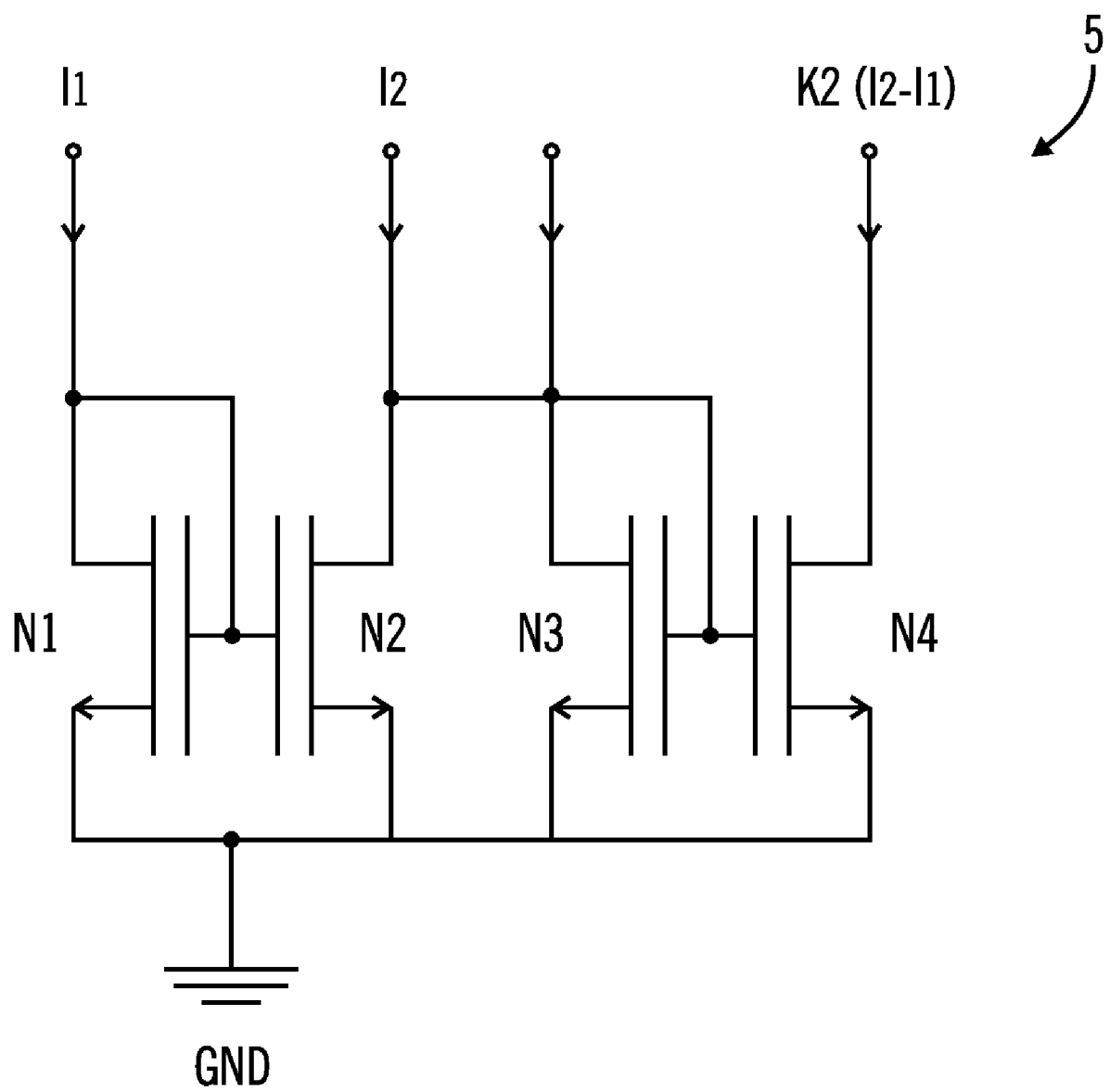
FIG. 3 shows further detail of the operational amplifier of FIG. 1.

In particular, to boost a tail current of the input differential pair of transistors M1 and M1, a current subtractor 5 is used, as shown in FIG. 3.

The current subtractor 5 comprises first and second additional transistors N1 and N2 having their control (or gate) terminals and first conductive terminals, in particular source terminals, in common. The common source terminals are connected to ground GND.

The first additional transistor N1 has a second conductive terminal, in particular a drain terminal, connected to its gate terminal and receiving a current I1, which is a copy of the current flowing in the first input transistor M1 of the OTA 2. Moreover, the second additional transistor N2 has a second conductive terminal, in particular a drain terminal, receiving a current I2, which is a copy of the current flowing in the second input transistor M2 of the OTA 2.

The current subtractor 5 further comprises third and fourth additional transistors N3 and N4 having their control (or gate) terminals and first conductive terminals, in particular source terminals, in common. The common source terminals are connected to ground GND.

The third additional transistor N3 has a second conductive terminal, in particular a drain terminal, connected to its gate terminal and to the source terminal of the second additional transistor N2 and receiving the current I2, which is a copy of the current flowing in the second input transistor M2 of the OTA 2.

The fourth additional transistor N4 has a second conductive terminal in which flows a boost current Iss given by the following equation.

$$Iss = K2(I2 - I1) \qquad (1)$$

The current subtractor 5 is connected in parallel to the tail current generator G1 of the OTA 2. In particular, as shown in FIG. 1, the adaptive bias block 3 comprises first and second current subtractor 5 and 5B connected between the first common node X1 and ground GND. In this way, the current subtractor 5 works correctly in the case of a signal applied to the first input terminal IN− of the OTA 2 which has a greater value than a signal applied to its second input terminal IN+, as well in the opposite signal condition. More specifically, the drain terminals of the fourth transistors N4 of the current subtractors 5 and 5B are connected to the first common node X1.

The adaptive bias block 3 also comprises first and second mirror blocks 6 and 6B connected between the supply voltage reference Vdd and the current subtractors 5 and 5B. The mirror blocks 6 and 6B each comprise fifth and sixth additional transistors N5 and N6 respectively connected between the supply voltage reference Vdd and the drain terminals of the first and second additional transistors N1 and N2. The fifth and sixth additional transistors N5 and N6 have control (or gate) terminals connected to the first and second internal nodes A and B in order to provide the copy-currents I1 and I2 to the current subtractors 5 and 5B.

In this way, in quiescent condition, no boost current Iss is generated because there is no current flowing through the additional third transistors N3 and consequently through the additional fourth transistors N4.

When the input voltages at the input terminals IN− and IN+ are unbalanced, the currents I1 and I2 flowing in the first and second input transistors, M1 and M2 (and thus the copy-currents provided to the current subtractors 5 and 5B) are different so that a boost current Iss flows in the fourth additional transistors N4 according to the above equation (1).

The drain terminal of the fourth additional transistor N4 is in parallel with the tail current generator G1 so that the bias current Ib of the op-amp 1 is signal dependent, with the adaptive bias block 3 realizing an adaptive bias mechanism as explained above.

The parameter K2 is usually indicated as the current feedback factor and is related to the stability of the whole op-amp 1.

When the input transistors M1 and M2 of the OTA 2 are operating in the weak inversion region, a maximum value of transconductance for a given current is reached, thus fulfilling low power requirements.

In particular, with Vin indicating the voltage across the gate terminals of the input transistors M1 and M2, which correspond to the input terminals IN− and IN+ of the op-amp 1, the following relation is verified:

$$I1 = I2 \cdot \exp(Vin/(nV_T)) \quad (2)$$

with n being the weak inversion slope factor and $V_T$ being the threshold voltage of the input transistors M1 and M2.

For a current feedback factor K2 between 0 and 1, the maximum value of the possible load current at the output terminal OUT of the op-amp 1 is limited to the value: Ib/(1−K2).

If the current feedback factor K2 is larger than unity, the maximum value of the load current becomes unlimited, so that the op-amp 1 will never slew.

In real conditions, such output current, of course, will not reach an infinite value because the input transistors M1 and M2 will switch in the weak inversion region.

According to this embodiment of the present invention, the OTA core 2 of the op-amp 1 further comprises a positive feedback network 7 connected between the supply voltage reference Vdd and the first and second internal nodes A and B.

In particular, the positive feedback network 7 comprises first and second feedback transistors M9 and M10. The first feedback transistor M9 is connected between the supply voltage reference Vdd and the first internal node A and has a control (or gate) terminal connected to the second internal node B. The second feedback transistor M10 is connected between the supply voltage reference Vdd and the second internal node B and has a control (or gate) terminal connected to the first internal node A.

In this way, in this embodiment of the present invention in bias conditions, a good current mirror between the input transistors M1 and M2 of the op-amp 1 and the adaptive bias block 3 is guaranteed, so that the power consumption of the op-amp 1 can be controlled. More particularly, the op-amp 1 has a good control of the current which flows in the overall architecture, being substantially made up of multiple current mirrors, thus improving the op-amp performance with respect to the known class AB op-amps having a push/pull architecture, in which the current is not well controlled, especially in process corners.

The impedance at the internal nodes A and B is equal to 1/gm3,4 when no positive feedback network 7 is provided, with gm3,4 being the transconductance value of the first input stage load transistors M3 and M4.

In this embodiment of the present invention, the positive feedback network 7 adds a feedback transistor M9 and M10 in parallel to each branch of the input stage load 4C (i.e., to the first input stage load transistors M3 and M4, respectively).

The gate terminal of each of the feedback transistors M9 and M10 is connected to a drain terminal of an input stage load transistor in an opposite branch M4 and M3, respectively.

In this way, a parallel resistance equal to −1/gm9,10 (with gm9,10 being the transconductance value of the feedback transistors M9 and M10) is added at the first and second internal nodes A and B, so that an infinite impedance is theoretically reached, if output resistances of these transistors are neglected.

The op-amp 1 according to this embodiment of the present invention thus has a higher DC-gain with respect to the known solutions, without increasing the power consumption. More particularly, the DC-gain of the op-amp 1 can be calculated as follows:

$$A_{dc,in} = \frac{gm1}{gm3 - gm5 + gds3 + gds5 + gds1} \quad (3)$$

with gm1, gm3, and gm5 being the transconductance value of the transistors M1, M3 and M5; and gds1, gds3 and gds5 being the drain-source conductance of the transistors M1, M3 and M5.

In summary, the input transistors M1 and M2 and the feedback transistors M9 and M10 of the positive feedback network 7 form a positive feedback loop.

Furthermore, as is well known, in order to guarantee the stability of a positive loop, its loop gain has to be inferior to unity. For the op-amp 1 of FIG. 1, the loop gain Gloop can be calculated as follows:

$$Gloop = \frac{gm5}{gm3 + gds3 + gds5 + gds1} \quad (4)$$

with gm3 and gm5 being the transconductance value of the transistors M3 and M5; and gds1, gds3 and gds5 being the drain-source conductance of the transistors M1, M3 and M5.

If the transconductance value gm3 of the first input stage load transistor M3 is equal to the transconductance value gm5 of the mirror transistor M5, the stability of the positive loop of the op-amp 1 is guaranteed by the parasitic resistances inherent to the op-amp 1.

In particular, a DC-gain equal to 90 dB is comparable to a typical two stage op-amp.

Figure 4:
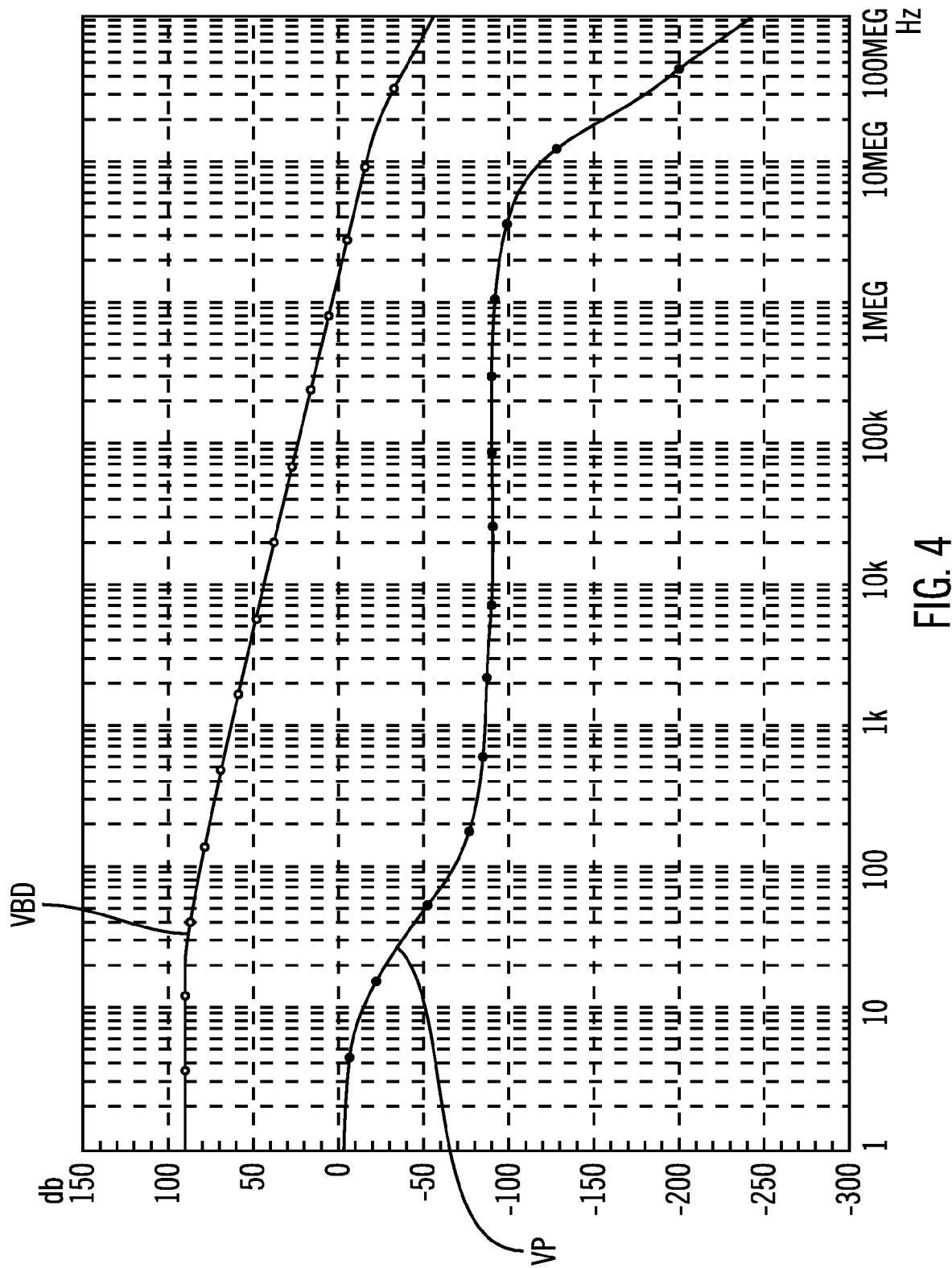
FIG. 4 shows a bode diagram of the operational amplifier of FIG. 1.

A Bode diagram of the op-amp 1 is shown in FIG. 4. It can be verified that the DC-gain is high as a two poles known system and the phase margin is equal to 85°.

The presence of the two poles also highlight the need for a compensation mechanism for ensuring the stability of the op-amp 1.

For the sake of stability, according to this embodiment of the present invention, the op-amp 1 further comprises an RC network compensation circuit 8 for providing compensation via the Miller effect.

More particularly, the RC network compensation circuit 8 comprises a capacitor Cc and a resistor Rc connected in series between the second internal node B and the output terminal OUT of the op-amp 1.

In this way, the RC network compensation circuit 8 introduces a zero according to the following relation.

$$z = \frac{1}{Cc\left(\frac{1}{gm} - Rc\right)} \quad (5)$$

To push the frequency of the introduced zero to infinity, the value of the resistor Rc is chosen equal to 1/gm, thus avoiding the introduction of a pole-zero doublet.

As is well known, the transconductance value of a transistor can be calculated, in the strong and weak inversion condition, as follows.

$$gm, \text{strong} = \sqrt{2\mu Cox \frac{W}{L} Id} \quad (6)$$

$$gm, \text{weak} = \frac{Id}{nV_T} \quad (7)$$

The equations (6) and (7) presume a small signal at the input terminals IN− and IN+ of the op-amp 1. However, according to this embodiment of the present invention, these equations are still effective in the case of large signals by replacing the current value Id with half of the load current given by the following equation:

$$Iss = Ib + K2|(I2-I1)| \quad (8)$$

and choosing a value of the current feedback factor K2 equal to or smaller than unity, with Ib being the current available in the quiescent condition at the sources of coupled transistor pairs.

The stability of the op-amp 1 when a large signal is applied to its input terminals IN− and IN+ has been estimated by using the technique described by PALUMBO et al. in the article "Feedback Amplifier" (Kluwer, Boston, p. 90, 2002).

In particular, as described in this article, a relative stability can be characterized by the phase margin (PM) in the frequency domain and by the overshoot of the step response in the time domain as a function of a separation factor W, which in the case of Miller compensation, are given by the following:

$$W = \frac{p_2}{\omega_{GBW}} = \frac{gmL/CL}{gm1/Cc} = \tan(PM) \quad (9)$$

and $$\text{overshoot} = e^{-\pi\sqrt{\frac{W}{4-W}}} \quad (10)$$

where gmL and gm1 are small signal transconductances of the output and input stages, respectively; and CL and Ccare are load and Miller capacitance, respectively.

From the above equations (9) and (10) it is verified that if small signal transconductances are replaced by amplitude dependent transconductances, as discussed above, relative stability is not changed, since the transconductance ratios of equation (9) will remain constant.

In other words, for large signals the op-amp 1 according to this embodiment of the present invention has approximately the same relative stability as its linear counterpart.

The above conclusion on stability is true if the input transistors M1 and M2 of the op-amp 1 and the output transistors work in the same region, in particular in the saturation or weak inversion regions.

More particularly, if the input transistors work in the weak inversion region, the small signal transconductance gm1 of the input transistors changes along with the drain current Id flowing in these transistors, and small signal transconductance gmL of the output transistors changes along with the root of the drain current Id flowing therein.

Thus, in the weak inversion conditions, the separation factor W decreases and, therefore, the phase margin PM is reduced and the stability could be compromised.

In this case, for a good compensation over all of the input dynamic range, according to one embodiment of the present invention, the current feedback factor K2 is chosen to be small, for instance between 0 and 1, so that the resistance value 1/gm1,2, which is signal dependent, does not change very much.

The above features of the op-amp 1 have been verified through suitable simulations.

In particular, the op-amp 1 has been designed in a 0.5 μm CMOS technology with a 2.4V supply voltage reference.

It has been thus verified that the current consumption is 10 μA for a total power consumption of 24 μW; the DC-gain of the op-amp 1 is 90 dB with a Gain BandWidth of 1.2 MHz; and in a buffer connected condition (i.e., using the positive feedback network 7), the op-amp 1 is able to drive a capacitive output load of 10 pF in a time of 1 μs with a precision of 0.1%.

Figure 5A:
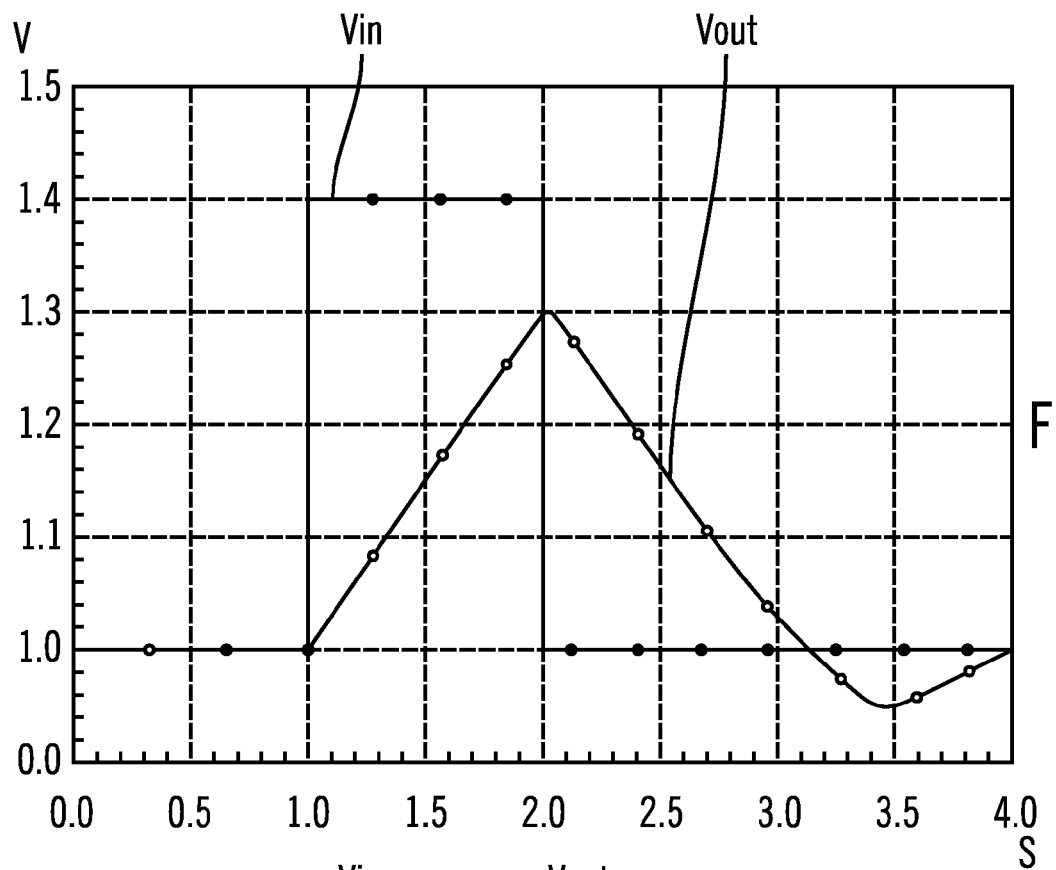
FIGS. 5A and 5B show internal signals of operational amplifiers with different configurations.
Figure 5B:
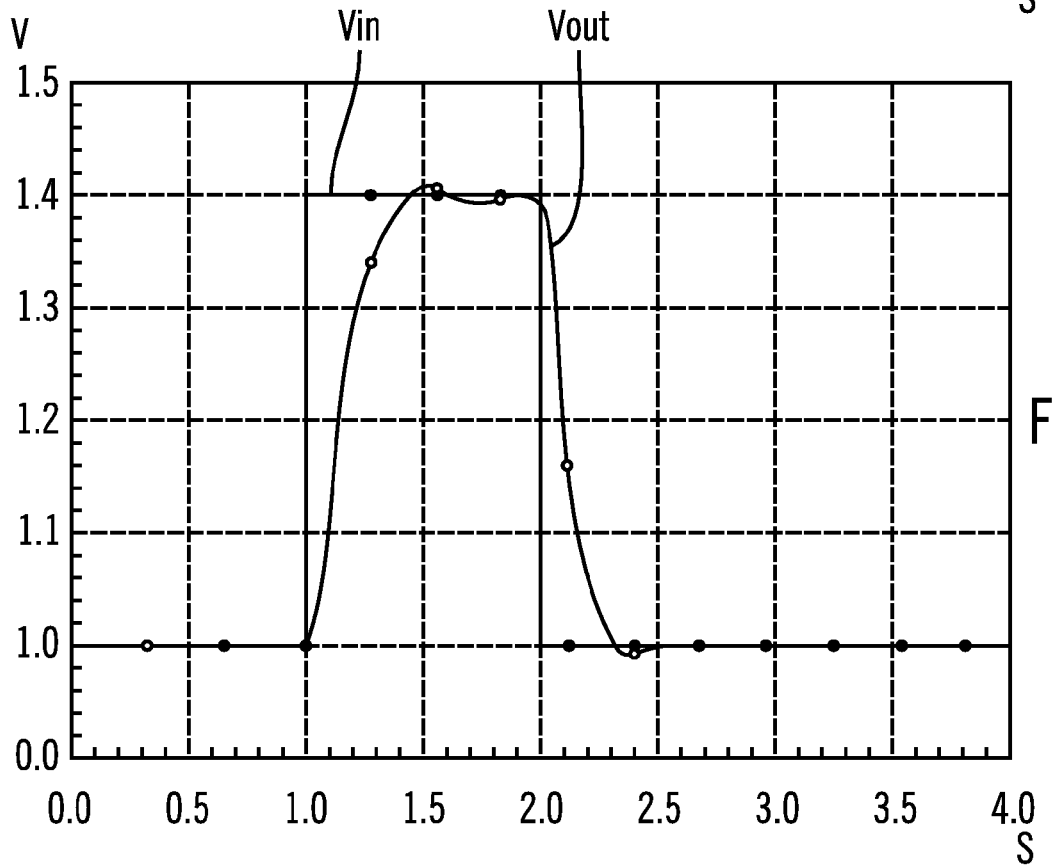

The results of the performed simulation are shown in FIGS. 5A and 5B.

More particularly, FIG. 5A shows an output voltage Vout generated by a buffer op-amp for an input voltage Vin that is a step of 0.4V when the adaptive bias mechanism is not used. In this condition, the op-amp suffers slew rate problems and the output voltage Vout does not reach a desired value.

The small current of the op-amp is in fact unable to drive in linear mode a load capacitor connected to its output terminal OUT and the slew rate is given by the current provided by the tail current generator G1 divided by the compensation capacitor Cc of the RC network compensation circuit 8.

FIG. 5B shows the same transient simulation for an op-amp 1 using the adaptive bias mechanism (i.e., including the adaptive bias block 3). In this case, the op-amp 1 settles in 1 μs with 0.1% of precision.

Thus, an op-amp according to the present invention having an adaptive bias block and a positive feedback network is able to charge a big capacitive load with very low current and sufficient precision (given by its high DC-gain) is achieved.

The following Table 1 shows the specifications of the op-amp which has been simulated and its measured features.

TABLE 1

| | |
|---|---|
| Technology | CMOS 0.5 μm |
| Power supply | 2.4 V |
| Cload | 10 pF |
| Settling time @ 0.1% | 1 μS |
| DC-gain | 90 dB |
| GBW | 1.2 MHz |
| Phase Margin | 85° |
| Power consumption | 24 μW |

Accordingly, the present invention provides an op-amp that is a class AB amplifier suitable for driving a large capacitive load in low-voltage, low-power applications having a low-power consumption and an adaptive biasing as well as an enhanced DC-gain.

The impedance seen at the drain terminals of the differential input pair of transistors M1 and M2 is enhanced by the positive feedback network 7 comprising the transistors M9 and M10 so as to enhance the gain of the whole op-amp 1.

Moreover, the op-amp 1 comprises an adaptive bias block 3 for regulating its own bias currents and for providing a better efficiency in the use of the supply current to charge and discharge an output load. In particular, if no signal is applied to the input terminals IN− and IN+, the op-amp 1 operates at a very low current level (i.e., in a sleep mode). When a differential signal Vin is applied to the input terminals IN− and IN+ of the op-amp 1, the current in the input transistors M1 and M2 is boosted to enhance the slew-rate and achieve a good settling within a required time. So, the bias currents are adjusted by sensing the input signal amplitude.

Furthermore, the op-amp 1 has a slew rate with a great boost so as to be able to manage a large input signal in the same manner as a small input signal.

Finally, the op-amp 1 solves the problem of the poor DC-gain of the known solution by using a positive feedback structure that enhances the whole op-amp gain up to 90 dB (i.e., like a two pole amplifier).

Thus, the op-amp topology is suitable for used in very low voltage applications (e.g., with a typical supply voltage of 1.2V, or even lower).

Useful applications of an op-amp according to the present invention are, for example, in the field of biomedical systems and micro-sensor systems in which power dissipation is an important specification for battery life.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A class AB operational amplifier comprising:
   a first input transistor coupled between a first internal node and a first common node, and having a control terminal coupled to a first differential input terminal;
   a second input transistor coupled between a second internal node and the first common node, and having a control terminal coupled to a second differential input terminal;
   a first input stage load transistor diode connected and coupled between a first voltage reference and the first internal node;
   a second input stage load transistor diode connected and coupled between the first voltage reference and the second internal node;
   first and second output transistors coupled in series between the first voltage reference and a second voltage reference, an interconnection node of the first and second output transistors being an output terminal of the operational amplifier, and the first output transistor having a control terminal connected to a control terminal of the second input stage load transistor;
   a tail current generator coupled between the first common node and the second voltage reference;
   an adaptive bias block coupled between the first and second voltage references, the adaptive bias block being coupled to the first common node; and
   a positive feedback network coupled between the first voltage reference and the first and second internal nodes,
   wherein the adaptive bias block comprises one or more circuits that each include a current subtractor that determines a difference between a current at the first internal node and a current at the second internal node and generates a boost current that is proportional to this difference.

2. The operational amplifier according to claim 1, wherein the positive feedback network comprises:
   a first feedback transistor coupled between the first voltage reference and the first internal node, the first feedback transistor having a control terminal connected to the second internal node; and
   a second feedback transistor coupled between the first voltage reference and the second internal node, the second feedback transistor having a control terminal connected to the first internal node.

3. The operational amplifier according to claim 2, further comprising a compensation circuit coupled between the second internal node and the output terminal.

4. The operational amplifier according to claim 3, wherein the compensation circuit comprises a capacitor and a resistor coupled in series between the second internal node and the output terminal.

5. The operational amplifier according to claim 1, further comprising a mirror transistor coupled between the first voltage reference and a second common node, the mirror transistor having a control terminal connected to the control terminal of the first input stage load transistor.

6. The operational amplifier according to claim 5, further comprising a biasing transistor diode connected and coupled between the second common node and the second voltage reference, the biasing transistor having a control terminal connected to a control terminal of the second output transistor.

7. The operational amplifier according to claim 1, wherein the one or more circuits of the adaptive bias block each include the current subtractor and a mirror block coupled in series between the first and second voltage references.

8. The operational amplifier according to claim 1, wherein the boost current generated by the current subtractor is the difference between the current at the first and second internal nodes multiplied by a current feedback factor.

9. The operational amplifier according to claim 1, wherein the one or more circuits of the adaptive bias block each also include first and second current mirror transistors that are coupled to the current subtractor, the first current mirror transistor mirroring the current at the first internal node and providing this current to the current subtractor, and the second current mirror transistor mirroring the current at the second internal node and providing this current to the current subtractor.

10. The operational amplifier according to claim 1, wherein the current subtractor includes third and fourth additional transistors having their control terminals connected together and to a mirror block, and having their first conductive terminals connected together and to the second voltage reference, the third additional transistor having a second conductive terminal connected to its control terminal and to the mirror block, and the fourth additional transistor having a second conductive terminal connected to the first common node, the boost current flowing in the fourth additional transistor.

11. The operational amplifier according to claim 1, wherein the current subtractor is coupled to the first common node such that the boost current generated by the current subtractor is added to a current generated by the tail current generator.

12. A class AB operational amplifier comprising:

a first input transistor coupled between a first internal node and a first common node, and having a control terminal coupled to a first differential input terminal;

a second input transistor coupled between a second internal node and the first common node, and having a control terminal coupled to a second differential input terminal;

a first input stage load transistor diode connected and coupled between a first voltage reference and the first internal node;

a second input stage load transistor diode connected and coupled between the first voltage reference and the second internal node;

first and second output transistors coupled in series between the first voltage reference and a second voltage reference, an interconnection node of the first and second output transistors being an output terminal of the operational amplifier, and the first output transistor having a control terminal connected to a control terminal of the second input stage load transistor;

a tail current generator coupled between the first common node and the second voltage reference;

an adaptive bias block coupled between the first and second voltage references, the adaptive bias block being coupled to the first common node; and a positive feedback network coupled between the first voltage reference and the first and second internal nodes, wherein the adaptive bias block comprises one or more circuits that each include a current subtractor and a mirror block coupled in series between the first and second voltage references, and the current subtractor comprises:

first and second additional transistors having their control terminals connected together and to the mirror block, and having their first conductive terminals connected together and to the second voltage reference, the first additional transistor having a second conductive terminal connected to its control terminal and to the mirror block, and the second additional transistor having a second conductive terminal connected to the mirror block; and third and fourth additional transistors having their control terminals connected together and to the second control terminal of the second additional transistor, and having their first conductive terminals connected together and to the second voltage reference, the third additional transistor having a second conductive terminal connected to its control terminal and to the mirror block, and the fourth additional transistor having a second conductive terminal connected to the first common node.

13. The operational amplifier according to claim 12, wherein the mirror block comprises:

a fifth additional transistor coupled between the first voltage reference and the second conductive terminal of the first additional transistor, the fifth additional transistor having a control terminal connected to the first internal node; and a sixth additional transistor coupled between the first voltage reference and the second conductive terminals of the second additional transistor, the sixth additional transistor having a control terminal connected to the second internal node.

14. A class AB operational amplifier comprising:

a first input transistor coupled between a first internal node and a first common node, and having a control terminal coupled to a first differential input terminal;

a second input transistor coupled between a second internal node and the first common node, and having a control terminal coupled to a second differential input terminal;

a first input stage load transistor diode connected and coupled between a first voltage reference and the first internal node;

a second input stage load transistor diode connected and coupled between the first voltage reference and the second internal node;

first and second output transistors coupled in series between the first voltage reference and a second voltage reference, an interconnection node of the first and second output transistors being an output terminal of the operational amplifier, and the first output transistor having a control terminal connected to a control terminal of the second input stage load transistor;

a tail current generator coupled between the first common node and the second voltage reference;

an adaptive bias block coupled between the first and second voltage references, the adaptive bias block being coupled to the first common node; and a positive feedback network coupled between the first voltage reference and the first and second internal nodes, wherein the adaptive bias block comprises first and second circuits that each include a current subtractor and a mirror block coupled in series between the first and second voltage references.

15. An integrated circuit including at least one class AB operational amplifier, the operational amplifier comprising:

a first input transistor coupled between a first internal node and a first common node, and having a control terminal coupled to a first differential input terminal;

a second input transistor coupled between a second internal node and the first common node, and having a control terminal coupled to a second differential input terminal;

a first input stage load transistor diode connected and coupled between a first voltage reference and the first internal node;

a second input stage load transistor diode connected and coupled between the first voltage reference and the second internal node;

first and second output transistors coupled in series between the first voltage reference and a second voltage reference, an interconnection node of the first and second output transistors being an output terminal of the operational amplifier, and the first output transistor having a control terminal connected to a control terminal of the second input stage load transistor;

a tail current generator coupled between the first common node and the second voltage reference;

an adaptive bias block coupled between the first and second voltage references, the adaptive bias block being coupled to the first common node; and a positive feedback network coupled between the first voltage reference and the first and second internal nodes, wherein the adaptive bias block comprises one or more circuits that each include a current subtractor that determines a difference between a current at the first internal node and a current at the second internal node and generates a boost current that is proportional to this difference.

16. The integrated circuit according to claim 15, wherein the positive feedback network of the operational amplifier comprises:

a first feedback transistor coupled between the first voltage reference and the first internal node, the first feedback transistor having a control terminal connected to the second internal node; and a second feedback transistor coupled between the first voltage reference and the second internal node, the second feedback transistor having a control terminal connected to the first internal node.

17. The integrated circuit according to claim 16, wherein the operational amplifier further comprises a compensation circuit coupled between the second internal node and the output terminal.

18. The integrated circuit according to claim 15, wherein the operational amplifier further comprises a mirror transistor coupled between the first voltage reference and a second common node, the mirror transistor having a control terminal connected to the control terminal of the first input stage load transistor.

19. The integrated circuit according to claim 18, wherein the operational amplifier further comprises a biasing transistor diode connected and coupled between the second common node and the second voltage reference, the biasing transistor having a control terminal connected to a control terminal of the second output transistor.

20. The integrated circuit according to claim 15, wherein the one or more circuits of the adaptive bias block of the operational amplifier each include the current subtractor and a mirror block coupled in series between the first and second voltage references.

21. The integrated circuit according to claim 20, wherein the current subtractor of the operational amplifier comprises:

first and second additional transistors having their control terminals connected together and to the mirror block, and having their first conductive terminals connected together and to the second voltage reference, the first additional transistor having a second conductive terminal connected to its control terminal and to the mirror block, and the second additional transistor having a second conductive terminal connected to the mirror block; and third and fourth additional transistors having their control terminals connected together and to the second control terminal of the second additional transistor, and having their first conductive terminals connected together and to the second voltage reference, the third additional transistor having a second conductive terminal connected to its control terminal and to the mirror block, and the fourth additional transistor having a second conductive terminal connected to the first common node.

22. The integrated circuit according to claim 21, wherein the mirror block of the operational amplifier comprises:

a fifth additional transistor coupled between the first voltage reference and the second conductive terminal of the first additional transistor, the fifth additional transistor having a control terminal connected to the first internal node; and a sixth additional transistor coupled between the first voltage reference and the second conductive terminals of the second additional transistor, the sixth additional transistor having a control terminal connected to the second internal node.

* * * * *